(12) United States Patent
Kim et al.

(10) Patent No.: US 7,843,211 B2
(45) Date of Patent: Nov. 30, 2010

(54) IMPEDANCE ADJUSTING CIRCUIT AND SEMICONDUCTOR MEMORY DEVICE HAVING THE SAME

(75) Inventors: Ki-Ho Kim, Kyoungki-do (KR); Seok-Cheol Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 23 days.

(21) Appl. No.: 12/006,112

(22) Filed: Dec. 31, 2007

(65) Prior Publication Data

US 2009/0003090 A1 Jan. 1, 2009

(30) Foreign Application Priority Data

Jun. 26, 2007 (KR) .................... 10-2007-0063313

(51) Int. Cl.
*H03K 17/16* (2006.01)

(52) U.S. Cl. ....................... 326/30

(58) Field of Classification Search ........... 326/30, 326/113
See application file for complete search history.

(56) References Cited

U.S. PATENT DOCUMENTS

| | | | |
|---|---|---|---|
| 6,836,144 B1 * | 12/2004 | Bui et al. | 326/32 |
| 6,958,613 B2 | 10/2005 | Braun et al. | |
| 6,980,020 B2 | 12/2005 | Best et al. | |
| 7,151,390 B2 | 12/2006 | Nguyen et al. | |
| 7,170,313 B2 | 1/2007 | Shin | |
| 7,176,711 B2 | 2/2007 | Park et al. | |
| 2004/0236814 A1 * | 11/2004 | White | 708/505 |
| 2006/0226868 A1 * | 10/2006 | Lee et al. | 326/30 |
| 2007/0126466 A1 * | 6/2007 | Kim | 326/30 |
| 2007/0236247 A1 * | 10/2007 | Wang et al. | 326/30 |

FOREIGN PATENT DOCUMENTS

| | | |
|---|---|---|
| JP | 2005-285125 | 10/2005 |
| JP | 2006-129423 | 5/2006 |
| KR | 20050101865 | 10/2005 |

* cited by examiner

*Primary Examiner*—Rexford N Barnie
*Assistant Examiner*—Thienvu V Tran
(74) *Attorney, Agent, or Firm*—Blakely, Sokoloff, Taylor & Zafman (57) ABSTRACT

An impedance adjusting circuit includes: a calibration circuit configured to generate a first calibration code and a second calibration code for determining termination resistance; a transmission line circuit configured to transfer the first calibration code during a first section and to transfer the second calibration code during a second section; and a termination resistor circuit adapted to match an impedance with a resistance determined by receiving the first and second calibration codes.

31 Claims, 9 Drawing Sheets

IMPEDANCE ADJUSTING CIRCUIT AND SEMICONDUCTOR MEMORY DEVICE HAVING THE SAME

CROSS-REFERENCE TO RELATED APPLICATIONS

The present invention claims priority of Korean patent application number 10-2007-0063313, filed on Jun. 26, 2007, which is incorporated by reference in its entirety.

BACKGROUND OF THE INVENTION

The present invention relates to an impedance adjusting circuit and a semiconductor memory device having the same, and more particularly, to an impedance adjusting circuit with a reduced area.

Semiconductor devices are implemented into integrated circuit (IC) chips such as central processing units (CPUs), memories, and gate arrays, and are incorporated into a variety of electrical products such as personal computers, servers and workstations. Most semiconductor devices include a receiving circuit configured to receive external signals via input pads and an output circuit configured to provide internal signals externally via output pads.

As the operating speed of electrical products is increasing, a swing width of a signal exchanged between semiconductor devices is being gradually reduced for minimizing a delay time taken for signal transmission. However, the reduction in the swing width of the signal has a great influence on an external noise, causing the signal reflectance to become more critical at an interface terminal due to impedance mismatch. Such impedance mismatch is generally caused by an external noise, a variation of a power voltage, a change of an operating temperature, a change of a manufacturing process, etc. The impedance mismatch may lead to a difficulty in a high-speed transmission of data and a distortion in output data. Therefore, if semiconductor devices receive the distorted output signal through an input terminal, it frequently gives rise to problems such as a setup/hold failure and an error in decision of an input level.

In particular, in order to resolve the above problems, a memory device requiring high-speed performance employs an impedance adjusting circuit, which is called an impedance adjusting circuit, around an input pad inside an IC chip. In a typical impedance adjusting circuit scheme, source termination is performed at a transmitting end by an output circuit, and parallel termination is performed by a termination circuit connected in parallel with respect to a receiving circuit coupled to the input pad.

ZQ calibration refers to a procedure of generating pull-up and pull-down codes which are varied with PVT (process, voltage and temperature) conditions. The resistance of the impedance adjusting circuit, e.g., a termination resistance at a DQ pad in a memory device, is calibrated using the codes resulting from the ZQ calibration. Here, the term of ZQ calibration is attributed to the fact that the calibration is performed using a ZQ node.

Hereinafter, how the ZQ calibration is performed in an impedance adjusting circuit will be described.

Figure 1:
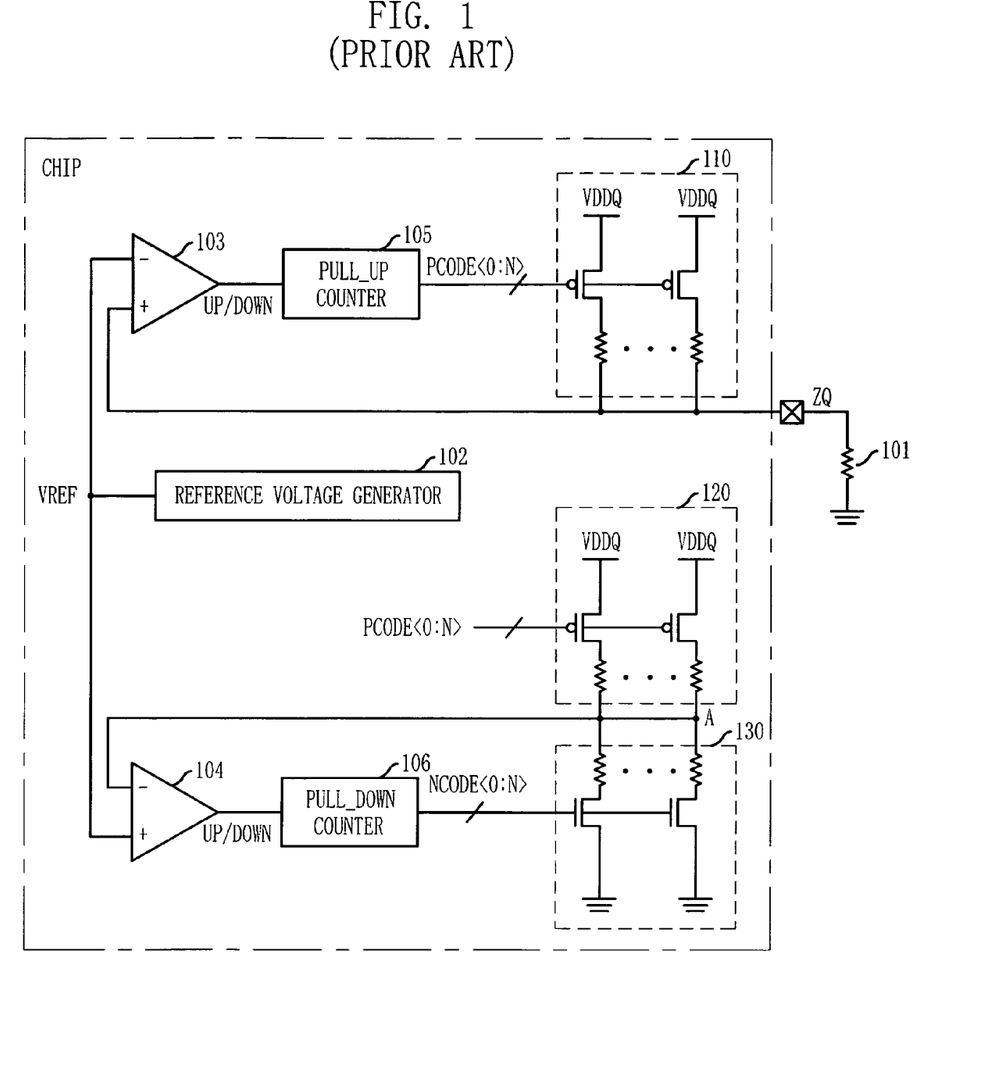
FIG. 1 is a block diagram of a calibration circuit for performing a ZQ calibration in a conventional impedance adjusting circuit.

FIG. 1 is a block diagram of a calibration circuit for performing a ZQ calibration in a conventional impedance adjusting circuit.

Referring to FIG. 1, the conventional impedance adjusting circuit configured to perform ZQ calibration includes a first calibration resistor circuit 110, a second calibration resistor circuit 120 and 130, a reference voltage generator 102, first and second comparators 103 and 104, and pull-up and pull-down counters 105 and 106. The first calibration resistor circuit 110 is provided with a plurality of pull-up resistors which are turned on/off in response to a pull-up calibration code PCODE<0: N>. The second calibration resistor circuit 120 and 130 includes a pull-up calibration resistor unit 120 and a pull-down calibration resistor unit 130. Here, the pull-up calibration resistor unit 120 has the same construction as the first calibration resistor circuit 110. The pull-down calibration resistor unit 130 is provided with a plurality of pull-down resistors which are turned on/off in response to a pull-down calibration code NCODE<0: N>.

The first calibration resistor circuit 110 generates the pull-up calibration code PCODE<0: N> primarily while being calibrated with an external resistor 101 connected to a ZQ node. The second calibration resistor circuit 120 and 130 generates the pull-down calibration code NCODE<0: N> secondarily using the pull-up calibration code PCODE<0: N> which has been generated through the first calibration resistor circuit 110.

The first comparator 103 compares a ZQ node voltage at the ZQ node with a reference voltage VREF (generally, set to VDDQ/2) generated from the reference voltage generator 102, thereby generating up/down signals UP/DOWN. Herein, the ZQ node voltage is generated by coupling the first calibration resistor circuit 110 to the external resistor 101 (generally, 240 Ω) connected to a ZQ pin that is disposed outside a chip of the ZQ node.

The pull-up counter 105 receives the up/down signals UP/DOWN to generate the pull-up calibration code PCODE<0: N> as a binary code, which turns on/off the pull-up resistors connected in parallel in the first calibration resistor circuit 110, thereby calibrating total resistance of the first calibration resistor circuit 110. The calibrated resistance of the first calibration resistor circuit 110 affects the ZQ node voltage again, and the above-described calibration procedure is then repeated. That is, the first calibration resistor circuit 110 is calibrated such that the total resistance of the first calibration resistor circuit 110 is equal to the resistance of the external resistor 101, which is called a pull-up calibration.

The binary code, i.e., the pull-up calibration code PCODE<0: N>, generated during the pull-up calibration is inputted into the pull-up calibration resistor unit 120 of the second calibration resistor circuit 120 and 130, thereby determining total resistance of the pull-up calibration unit 120. Thereafter, a pull-down calibration starts to be performed in a similar manner to the pull-up calibration. Specifically, the pull-down calibration unit 130 is calibrated such that a voltage of a node A is equal to the reference voltage VREF using the second comparator 104 and the pull-down counter 106, that is, the total resistance of the pull-down calibration resistor unit 130 is equal to the total resistance of the pull-up calibration resistor unit 120, which is called the pull-down calibration.

The binary codes PCODE<0: N> and NCODE<0: N> resulting from the ZQ calibration, i.e., pull-up and pull-down calibrations, are inputted to pull-up and pull-down resistors (termination resistors) at input/output pads, which are identically configured to the pull-up and pull-down calibration resistor units in the calibration circuit of FIG. 1, thus determining resistance of the impedance adjusting circuit. In a memory device, resistances of pull-up and pull-down resistors at a DQ pad are determined.

Figure 2:
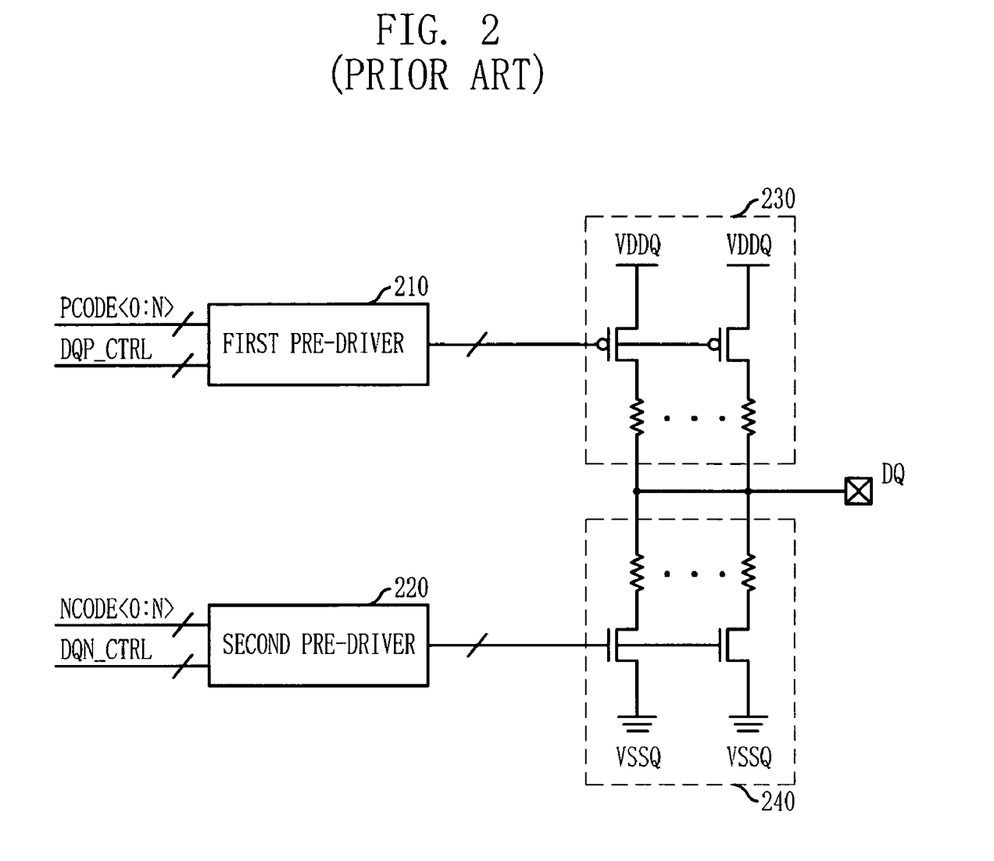
FIG. 2 is a block diagram illustrating how termination resistance of an output driver of a semiconductor memory device is determined using calibration codes generated from the calibration circuit of FIG. 1.

FIG. 2 is a block diagram illustrating how termination resistance of an output driver of a semiconductor memory device is determined using the calibration codes PCODE<0: N> and NCODE<0: N> generated from the calibration circuit of FIG. 1.

Referring to FIG. 2, the output driver configured to output data in the semiconductor memory device includes first and second pre-drivers 210 and 220 located at its upper and lower parts, and pull-up and pull-down termination resistor units 230 and 240 for outputting data.

The first and second pre-drivers 210 and 220 provided in the up/down circuits control the pull-up termination resistor unit 230 and the pull-down resistor unit 240, respectively. When outputting a data having a logic high level, the pull-up termination resistor unit 230 is turned on so that a data pin DQ goes to 'HIGH' state. On the contrary, when outputting a data having a logic low level, the pull-down termination resistor unit 240 is turned on so that the data pin DQ goes to 'LOW' state. That is, the data pin DQ is pull-up or pull-down terminated to thereby output a data of a logic high level or a logic low level.

At this time, the number of resistors in the pull-up and pull-down termination resistors 230 and 240 to be turned on is determined by the pull-up and pull-down calibration codes PCODE<0: N> and NCODE<0: N>. Specifically, which resistor unit is turned on between the pull-up and pull-down termination resistor units 230 and 230 is mainly determined depending on a logic level of output data, but which resistor is turned on among the termination resistors provided in one of the termination resistor units 230 and 240 that has been selected to be turned on is determined by the pull-up calibration code PCODE<0: N> or pull-down calibration code NCODE<0: N>.

For reference, target resistances of the pull-up and pull-down resistor units 230 and 240 are not necessarily equal to resistances (240 Ω) of the first and second resistor circuits (see "110", "120" and "130" of FIG. 1) but may have a resistance of one-half (120 Ω) or one-quarter (60 Ω) of 240 Ω, etc. In FIG. 2, reference symbols "DQP_CTRL" and "DQN_CTRL" inputted to the first and second pre-drivers 210 and 220 denote various control signals exemplarily.

Figure 3:
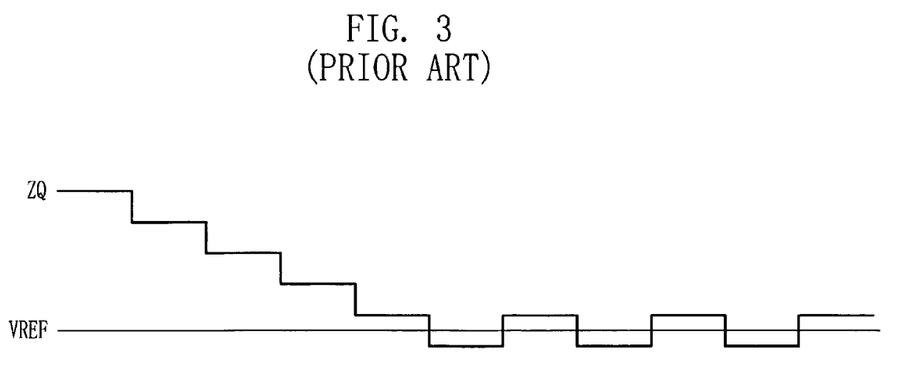
FIG. 3 illustrates a procedure while a ZQ node voltage is equalized to a reference voltage through calibration operation of FIG. 1.

FIG. 3 illustrates a procedure while the ZQ node voltage is equalized to the reference voltage through the calibration operation of FIG. 1.

In FIG. 3, there is shown bang-bang error occurring when the pull-up calibration code PCODE<0: N> is generated. The bang-bang error is a phenomenon that the ZQ node voltage keeps rising and falling at regular steps with respect to the reference voltage VREF during the calibration operation because the ZQ node voltage is not accurately equal to the reference voltage VREF.

Figure 4:
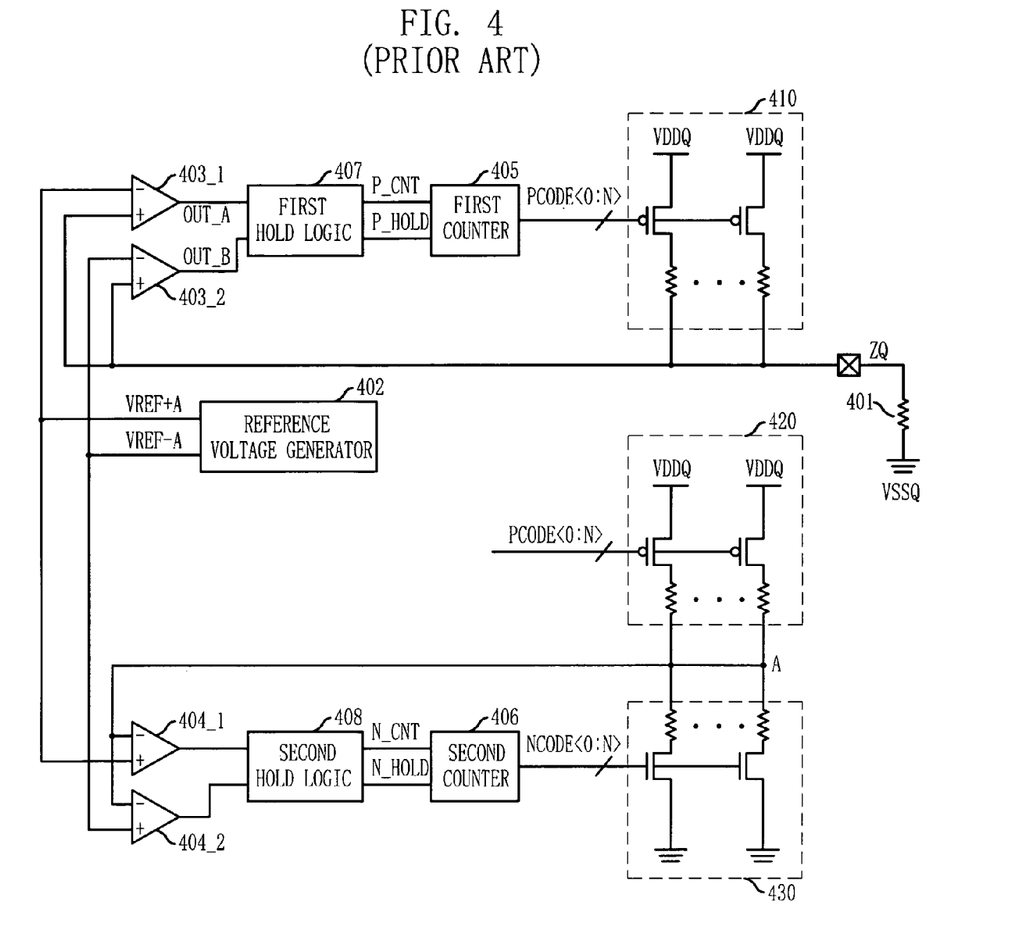
FIG. 4 is a block diagram illustrating another conventional calibration circuit in which the comparator of FIG. 1 is improved so as to remove a bang-bang error shown in FIG. 3.

FIG. 4 is a block diagram illustrating another conventional calibration circuit in which the comparator of FIG. 1 is improved so as to remove the bang-bang error shown in FIG. 3.

While the conventional calibration circuit of FIG. 1 employs the two comparators 103 and 104, another calibration circuit of FIG. 4 employs four comparators, i.e., first to fourth comparators 403_1, 403_2, 404_1 and 404_2, and first and second hold logics 407 and 408 located at upper and lower parts respectively.

As for a basic pull-up operation, the first comparator 403_1 compares the ZQ node voltage with a first reference voltage VREF+A, and the second comparator 403_2 compares the ZQ node voltage with a second reference voltage VREF−A. The case where outputs of the first and second comparators 403_1 and 403_2 differ from each other means that the ZQ node voltage is in the range between the first reference voltage VREF+A and the second reference voltage VREF−A. In this case, the first hold logic 407 generates a first hold signal P_HOLD to disable an operation of a first counter 405 and fixes the pull-up calibration code PCODE<0: N>. When the first hold signal P_HOLD is not activated, the counting of the first counter 405 is performed based on a first count signal P_CNT which is one of two outputs of the first and second comparators 403_1 and 403_2. Likewise, a pull-down operation is performed in the same manner as the pull-up operation.

Figure 5:
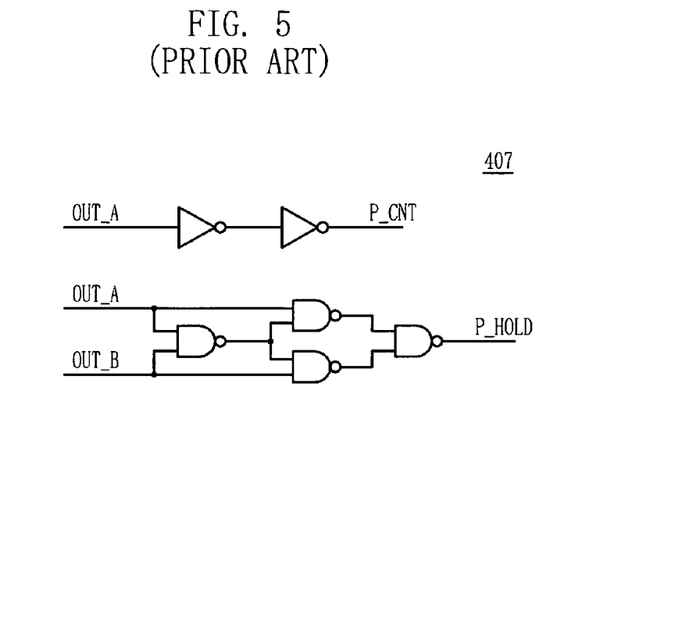
FIG. 5 is a circuit diagram illustrating a first hold logic in the calibration circuit of FIG. 4.

FIG. 5 is a circuit diagram illustrating the first hold logic 407 in the calibration circuit of FIG. 4. The second hold logic 408 has substantially the same structure as that of the first hold logic 407.

Herein, reference symbols "OUT_A" and "OUT_B" denote the output signals of the two comparators 403_1 and 403_2 or 404_1 and 404_2. When the output signals OUT_A and OUT_B have different logic levels, the first hold signal P_HOLD is activated to a logic high level and thus the counting of the first and second counters 405 or 406 is performed using the first count signal P_CNT having the same logic level as the output signal OUT_A.

Figure 6:
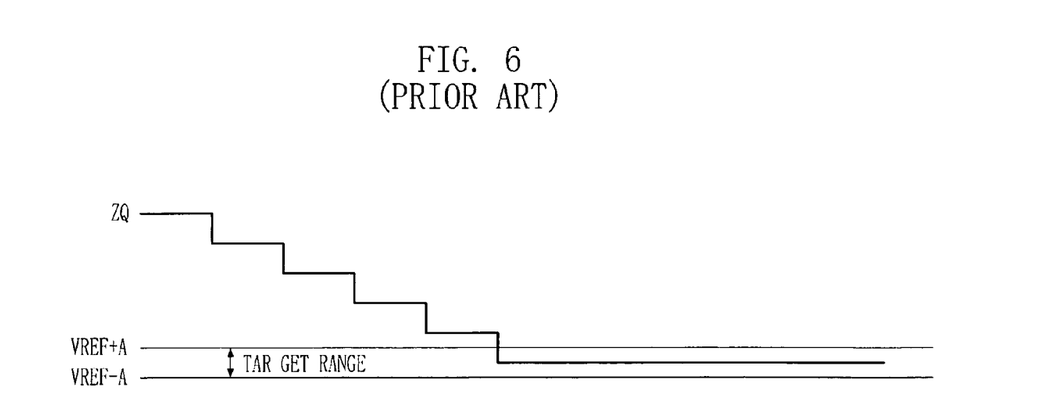
FIG. 6 illustrates a procedure while a ZQ node voltage is equalized to a reference voltage through the calibration operation of FIG. 4.

FIG. 6 illustrates a procedure while the ZQ node voltage is equalized to the reference voltage through the calibration operation described with reference to FIG. 4.

As shown in FIG. 6, it can be observed that the ZQ node voltage is fixed to a predetermined level once the ZQ node voltage falls within a target range.

Figure 7:
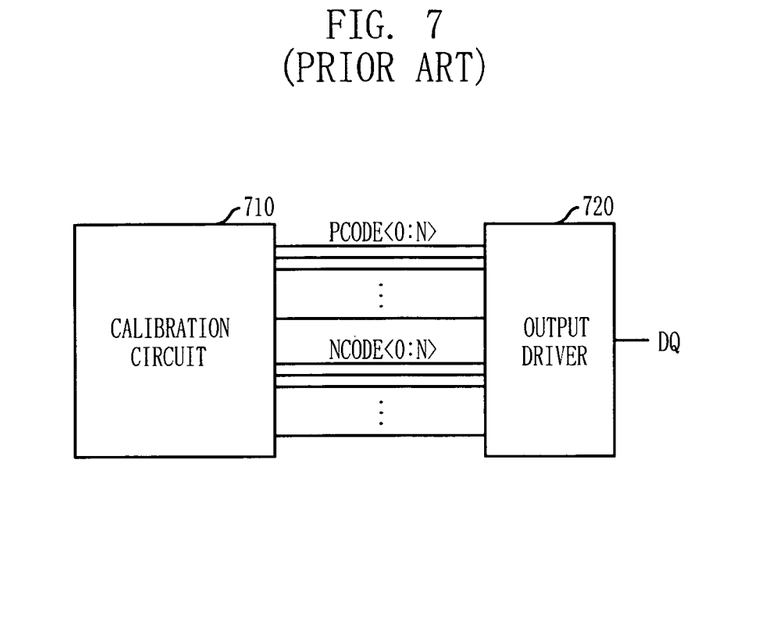
FIG. 7 is a block diagram illustrating transmission of calibration codes generated from a conventional calibration circuit to an output driver.

FIG. 7 is a block diagram illustrating transmission of the calibration codes generated from a conventional calibration circuit 710 to an output driver 720.

Referring to FIG. 7, the pull-up calibration code PCODE<0: N> and the pull-down calibration code NCODE<0: N>, which are generated in the conventional calibration circuit 710, are transferred to the output driver 720 through metal lines. Here, the number of metal lines should be 2*(N+1) because a total number of the pull-up and pull-down calibration codes is 2*(N+1). Such a great number of metal lines lead to increased chip area.

SUMMARY OF THE INVENTION

Embodiments of the present invention are directed to providing an impedance adjusting circuit with a reduced area by reducing the number of lines through which calibration codes are transferred, and a semiconductor memory device having the impedance adjusting circuit.

In accordance with an aspect of the present invention, there is provided an impedance adjusting circuit, including: a calibration circuit configured to generate a first calibration code and a second calibration code for determining termination resistance; a transmission line circuit configured to transfer the first calibration code during a first section and to transfer the second calibration code during a second section; and a termination resistor circuit adapted to match an impedance with a resistance determined by receiving the first and second calibration codes.

In accordance with another aspect of the present invention, there is provided a semiconductor memory device, including: a calibration circuit configured to generate a first calibration code and a second calibration code for determining termination resistance; a transmission line circuit configured to transfer the first calibration code during a first section and to transfer the second calibration code during a second section; and an output driver configured to pull-up terminate or pull-down terminate an output node with resistance determined by receiving the first and second calibration codes, and output data.

DESCRIPTION OF SPECIFIC EMBODIMENTS

Hereinafter, an impedance adjusting circuit and a semiconductor memory device having the same in accordance with the present invention will be described in detail with reference to the accompanying drawings.

Figure 8:
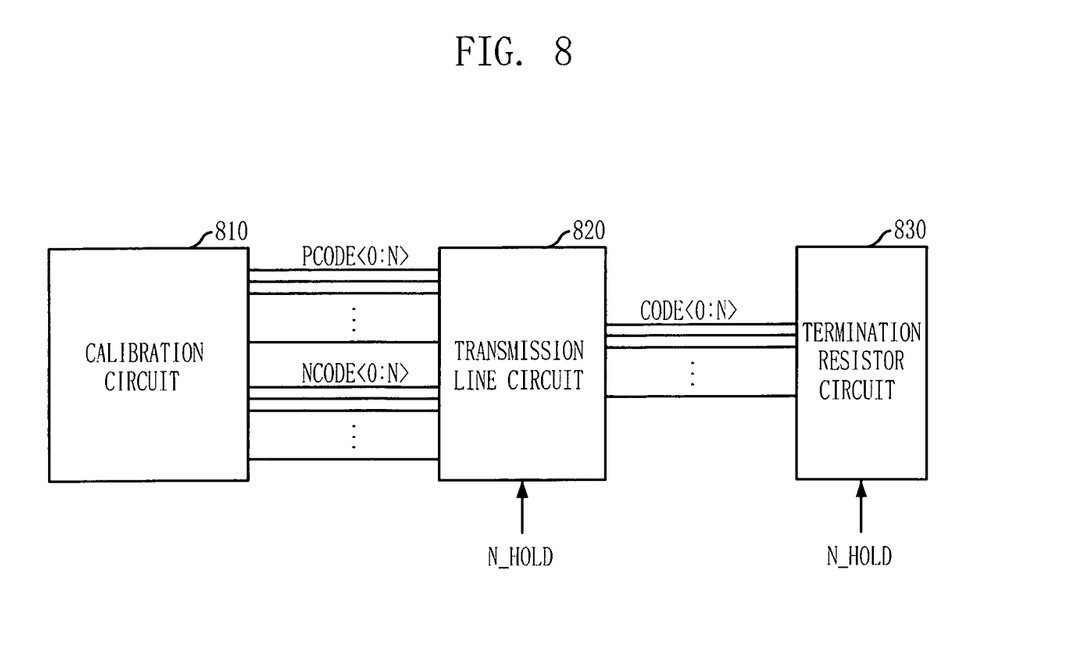
FIG. 8 is a block diagram of an impedance adjusting circuit in accordance with an embodiment of the present invention.

FIG. 8 is a block diagram of an impedance adjusting circuit in accordance with an embodiment of the present invention.

Referring to FIG. 8, the impedance adjusting circuit of the present invention includes a calibration circuit 810, a transmission line circuit 820 and a termination resistor circuit 830. The calibration circuit 810 generates a first calibration code PCODE<0: N> and a second calibration code NCODE<0: N> to determine termination resistance. The transmission line circuit 820 transfers the first calibration code PCODE<0: N> during a first section and transfers the second calibration code NCODE<0: N> during a second section. The termination resistor circuit 830 matches its impedance with that of resistance that is determined by receiving the first calibration code PCODE<0: N> and the second calibration code NCODE<0: N>.

Herein, the first calibration code means primarily generated calibration code, and the second calibration code means secondarily generated on the basis of the first calibration code. In the conventional case where the pull-up calibration code PCODE<0: N> is generated first and the pull-down calibration code NCODE<0: N> is then generated on the basis of the pull-up calibration code PCODE<0: N>, the pull-up calibration code PCODE<0: N> corresponds to the first calibration code and the pull-down calibration code NCODE<0: N> corresponds to the second calibration code.

The transmission line circuit 820 of the present invention includes a plurality of transmission lines CODE<0: N> configured to transfer the first and second calibration codes PCODE<0: N> and NCODE<0: N> to the termination resistor circuit 830 from the calibration circuit 810. That is, the first calibration code PCODE<0: N> and the second calibration code NCODE<0: N> share the same transmission lines. To share the same lines, therefore, the transmission line circuit 820 transfers the calibration codes during two separate sections. For example, the first calibration code PCODE<0: N> is transferred during the first section and the second calibration code NCODE<0: N> is transferred during the second section.

The first and second sections may be divided by a second hold signal N_HOLD activated when a ZQ node voltage falls within a target range based on the second calibration code NCODE<0: N>. Herein, detailed description for the second hold signal N_HOLD has been already illustrated in the Background of the Invention, and details are thus referred to the corresponding parts. As described already, the first calibration code PCODE<0: N> is generated first and fixed, i.e., a first hold signal P_HOLD is activated first, and thereafter the second calibration code NCODE<0: N> is generated and fixed when the second hold signal N_HOLD is activated. Therefore, sections before and after the activation of the second hold signal N_HOLD correspond to the first and second sections, respectively, so that it is possible to respectively transfer the first calibration code PCODE<0: N> and the second calibration code NCODE<0: N> using the same transmission lines CODE<0: N>.

The termination resistor circuit 830 matches the impedance with the resistance determined by receiving the first and second calibration codes PCODE<0: N> and NCODE<0: N> transferred from the transmission line circuit 820. As described above, in the case where the first calibration code is the pull-up calibration code PCODE<0: N> and the second calibration code is the pull-down calibration code NCODE<0: N>, the first calibration code PCODE<0: N> turns on/off pull-up termination resistors in the termination resistor circuit 830 and the second calibration code NCODE<0: N> turns on/off pull-down termination resistors in the termination resistor circuit 830. The first and second calibration codes PCODE<0: N> and NCODE<0: N> are transferred to the transmission line circuit 820 during the first section and the second section, respectively. Therefore, the pull-up termination resistors in the termination resistor circuit 830 are connected to the transmission line circuit 820 during the first section, and the pull-down termination resistors in the termination resistor circuit 830 are connected to the transmission line circuit 820 during the second section.

If the impedance adjusting circuit of the present invention is applied to a semiconductor memory device, the termination resistor circuit 830 is an output driver.

Figure 9:
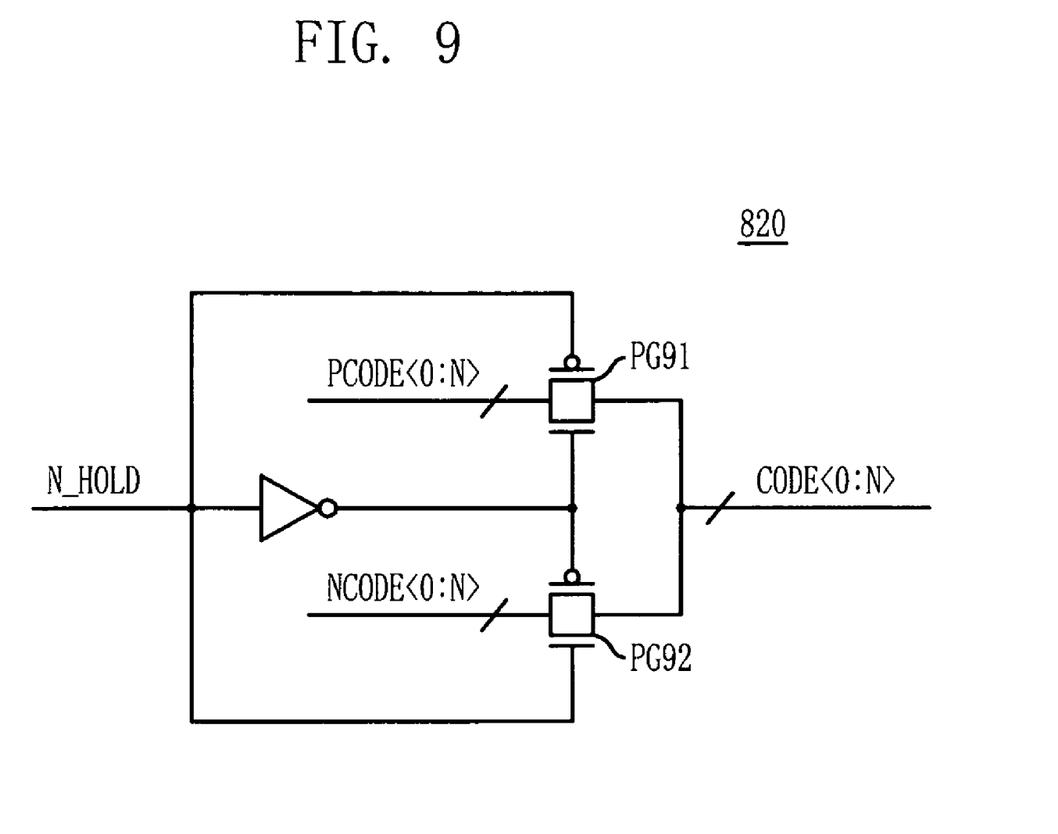
FIG. 9 is a circuit diagram illustrating a transmission line circuit used in the impedance adjusting circuit of FIG. 8.

FIG. 9 is a circuit diagram illustrating the transmission line circuit 820 used in the impedance adjusting circuit of FIG. 8.

Referring to FIG. 9, the transmission line circuit 820 includes the transmission lines CODE<01N>, a first pass gate PG91 configured to be turned on during the first section to transfer the first calibration code PCODE<0: N> to the transmission lines CODE<0: N>, and a second pass gate PG92 configured to be turned on during the second section to transfer the second calibration code PCODE<0: N> to the transmission lines CODE<0: N>. Although it is illustrated that each of the transmission line CODE<0: N>, the first pass gate PG91 and the second pass gate PG92 appear to be provided singularly, the transmission lines, the first pass gate PG91 and the second pass gate 92 should be actually provided as many as the number of codes, e.g., N+1.

When the second hold signal N_HOLD, which is a reference signal for dividing the first and second sections, is deactivated, the first pass gate PG91 is turned on so that the first calibration code PCODE<0: N> is transferred to the transmission lines CODE<0: N>. On the contrary, when the second hold signal N_HOLD is activated, the second pass gate PG92 is turned on so that the second calibration code NCODE<0: N> is transferred to the transmission lines CODE<0: N>.

Figure 10:
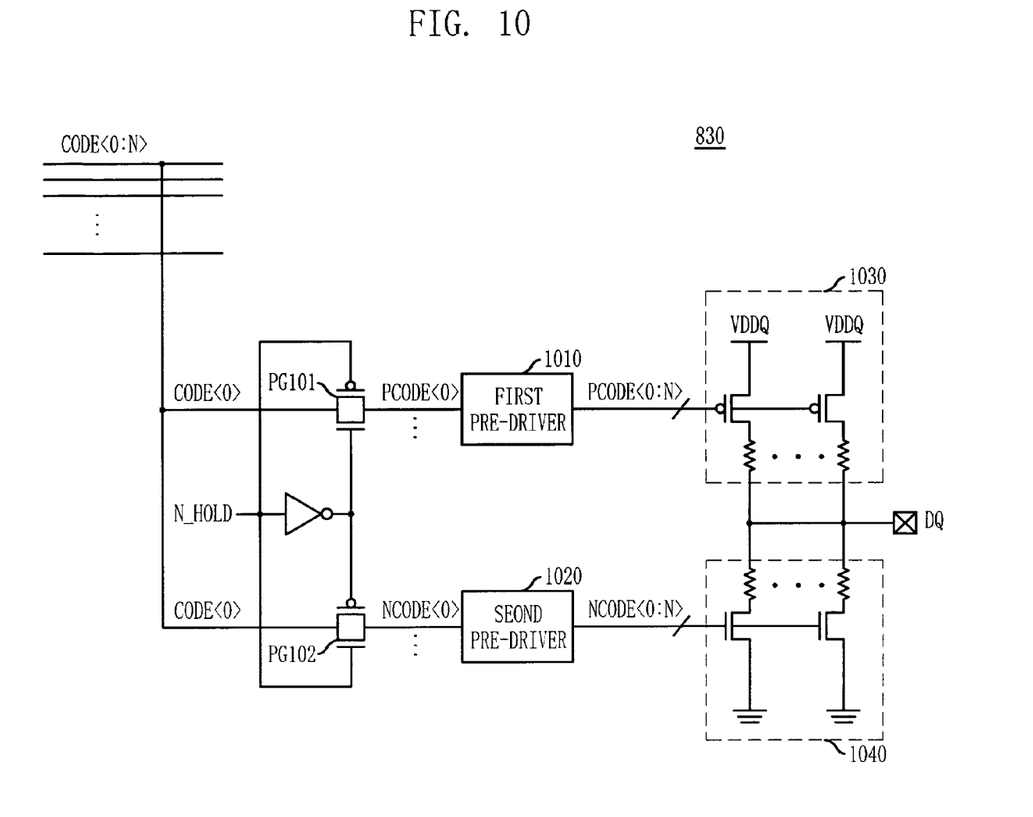
FIG. 10 is a block diagram illustrating a termination resistor circuit used in the impedance adjusting circuit of FIG. 8.

FIG. 10 is a block diagram illustrating the termination resistor circuit 830 used in the impedance adjusting circuit of FIG. 8.

Referring to FIG. 10, the termination resistor circuit 830 of the present invention includes pull-up termination resistors 1030 and pull-down termination resistors 1040, which receive the codes PCODE<0: N> and NCODE<0: N> transferred through the transmission lines CODE<0: N> depending on the first section or the second section. That is, if the first calibration code is the pull-up calibration code PCODE<0: N> and the second calibration code is the pull-down calibration code NCODE<0: N>, the transmission lines CODE<0: N> are connected to the pull-up termination resistors 1030 during the first section and thus the pull-up termination resistors 1030 receive the first calibration code PCODE<0: N>. Likewise, the transmission lines CODE<0: N> are connected to the pull-down termination resistors 1040 during the second section and thus the pull-down termination resistors 1040 receive the second calibration code NCODE<0: N>.

FIG. 10 exemplarily illustrates that the termination resistor circuit is an output driver by applying the impedance adjusting circuit of the present invention to the semiconductor memory device. Therefore, the first and second calibration codes PCODE<0: N> and NCODE<0: N> are inputted to first and second pre-drivers 1010 and 1020 to control the pull-up and pull-down termination resistors 1030 and 1040, respectively. As it is well known, the pull-up termination resistors 1030 of the output driver pull-up terminates the DQ node to output a data having a logic high level, whereas the pull-down calibration resistors 1040 of the output driver pull-down terminates the DQ node to output a data having a logic low level.

Though it is illustrated that only one of the first and second calibration codes PCODE<0> and NCODE<0> are inputted to the first and second pre-drivers 1010 and 1020, the other codes PCODE<1: N> and NCOD<1: N> are also inputted to the first and second pre-drivers 1010 and 1020 in the same manner as the PCODE<0> and NCODE<0>.

As for its operation, during the first section when the second hold signal N_HOLD is deactivated, a first pass gate PG101 is turned on so that the transmission lines CODE<0: N> are connected to the first pre-driver 1010. On the contrary, during the second section when the second hold signal N_HOLD is activated, a second pass gate PG102 is turned on so that the transmission lines CODE<0: N> are connected to the second pre-driver 1020.

Figure 11:
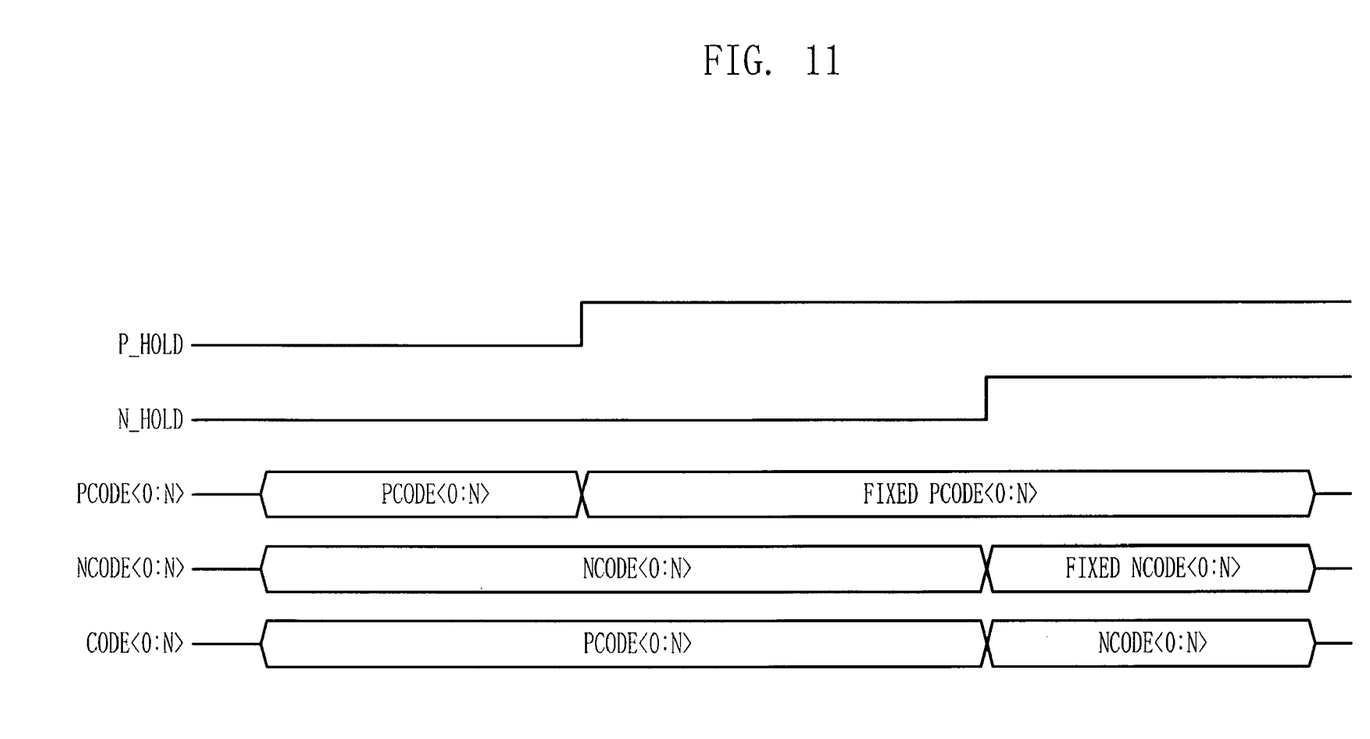
FIG. 11 is a timing diagram illustrating overall operation of the impedance adjusting circuit in accordance with an embodiment of the present invention.

FIG. 11 is a timing diagram illustrating overall operation of the impedance adjusting circuit in accordance with an embodiment of the present invention.

When a calibration operation starts to be performed, the first calibration code PCODE<0: N> is generated first and then fixed (referring to as "FIXED PCODE<0: N>") when the first hold signal P_HOLD is activated. Thereafter, the second calibration code NCODE<0: N> is fixed (referring to as "FIXED NCODE<0: N>") when the second hold signal N_HOLD is activated. The first calibration code PCODE<0: N> is carried on the transmission lines CODE<0: N> during the first section when the second hold signal N_HOLD is deactivated, whereas the second calibration code NCODE<0: N> is carried on the transmission lines CODE<0: N> during the second section when the second hold signal N_HOLD is activated. Therefore, the first and second calibration codes PCODE<0: N> and NCOD<0: N> can be transferred through the same transmission lines CODE<0: N>, and thus a required occupation area of the transmission lines CODE <0: N> decreases in half compared to the conventional art.

In an impedance adjusting circuit in accordance with the present invention, the first and second calibration codes, which have been transferred through different lines in the conventional art, can be transferred through the same transmission lines.

Accordingly, an area for the transmission lines decrease in half, which makes it possible to reduce a total chip area.

While the present invention has been described with respect to the specific embodiments, it will be apparent to those skilled in the art that various changes and modifications may be made without departing from the spirit and scope of the invention as defined in the following claims.

What is claimed is:

1. An impedance adjusting circuit, comprising:
    a calibration circuit configured to generate a first calibration code and a second calibration code for determining termination resistance;
    a transmission line circuit configured to receive the first and second calibration codes from the calibration circuit, to transfer the first calibration code through transmission lines during a first section and to transfer the second calibration code through the transmission lines during a second section; and
    a termination resistor circuit adapted to match an impedance with a resistance determined by receiving the first and second calibration codes,
    wherein the first and second calibration codes share the transmission lines while the first and second calibration codes are transferred to the termination resistor circuit.

2. The impedance adjusting circuit as recited in claim 1, wherein the first calibration code is generated earlier than the second calibration code.

3. The impedance adjusting circuit as recited in claim 1, wherein the first and second sections are divided by a hold signal that is activated when the second calibration code reaches a target range.

4. The impedance adjusting circuit as recited in claim 1, wherein the transmission line circuit comprises:
    transmission lines;
    first pass gates configured to be turned on during the first section to transfer the first calibration code to the transmission lines; and
    second pass gates configured to be turned on during the second section to transfer the second calibration code to the transmission lines.

5. The impedance adjusting circuit as recited in claim 4, wherein the first pass gates and the second pass gates are turned on/off in response to a hold signal activated when the second calibration code reaches a target range, the second calibration code being generated later than the first calibration code.

6. The impedance adjusting circuit as recited in claim 1, wherein the termination resistor circuit comprises pull-up termination resistors and pull-down termination resistors,
    the first or second calibration code, which is transferred through the transmission lines depending on the first section or the second section, being inputted to the pull-up termination resistors or the pull-down termination resistors.

7. The impedance adjusting circuit as recited in claim 6, wherein the termination resistor circuit further comprises:

first pass gates configured to be turned on during the first section to transfer the first calibration code to one of the pull-up termination resistors and the pull-down termination resistors; and second pass gates configured to be turned on during the second section to transfer the second calibration code to the other of the pull-up termination resistors and the pull-down termination resistors.

8. The impedance adjusting circuit as recited in claim 7, wherein the first pass gates and the second pass gates are turned on/off in response to a hold signal activated when the second calibration code reaches a target range, the second calibration code being generated later than the first calibration code.

9. The impedance adjusting circuit as recited in claim 1, wherein the first calibration code includes a pull-up calibration code, and the second calibration code includes a pull-down calibration code.

10. A semiconductor memory device, comprising:
a calibration circuit configured to generate a first calibration code and a second calibration code for determining termination resistance;
a transmission line circuit configured to receive the first and second calibration codes, to transfer the first calibration code through transmission lines during a first section and to transfer the second calibration code through the transmission lines during a second section; and
an output driver configured to pull-up terminate or pull-down terminate an output node with resistance determined by receiving the first and second calibration codes, and output data,
wherein the first and second calibration codes share the transmission lines while the first and second calibration codes are transferred to the output driver.

11. The semiconductor memory device as recited in claim 10, wherein the output node includes a DQ node.

12. The semiconductor memory device as recited in claim 10, wherein the first calibration code is generated earlier than the second calibration code.

13. The semiconductor memory device as recited in claim 12, wherein the first and second sections are divided by a hold signal that is activated when the second calibration code reaches a target range.

14. The semiconductor memory device as recited in claim 13, wherein the hold signal is generated through comparison of a second calibration node voltage and two reference voltages, the two reference voltages being different from each other by a width of the target range.

15. The semiconductor memory device as recited in claim 10, wherein the transmission line circuit comprises:
transmission lines;
first pass gates configured to be turned on during the first section to transfer the first calibration code to the transmission lines; and
second pass gates configured to be turned on during the second section to transfer the second calibration code to the transmission lines.

16. The semiconductor memory device as recited in claim 15, wherein the first pass gates and the second pass gates are turned on/off in response to a hold signal activated when the second calibration code falls within a target range, the second calibration code being generated later than the first calibration code.

17. The semiconductor memory device as recited in claim 10, wherein the output driver comprises:
a pull-up pre-driver and a pull-down pre-driver;
pull-up termination resistors configured to be turned on/off to output a data having a logic high level under control of the pull-up pre-driver; and
pull-down termination resistors configured to be turned on/off to output a data having a logic low level under control of the pull-down pre-driver.
the first or second calibration code, which is transferred to the transmission lines depending on the first section or the second section, being inputted to the pull-up pre-driver or the pull-down pre-driver.

18. The semiconductor memory device as recited in claim 17, wherein the output driver further comprises:
first pass gates configured to be turned on during the first section to transfer the first calibration code to one of the pull-up pre-driver and the pull-down pre-driver; and
second pass gates configured to be turned on during the second section to transfer the second calibration code to the other of the pull-up pre-driver and the pull-down pre-driver.

19. The semiconductor memory device as recited in claim 18, wherein the first pass gates and the second pass gates are turned on/off in response to a hold signal activated when the second calibration code reaches a target range, the second calibration code being generated later than the first calibration code.

20. The semiconductor memory device as recited in claim 10, wherein the first calibration code includes a pull-up calibration code, and the second calibration code includes a pull-down calibration code.

21. A semiconductor memory device, comprising:
a calibration circuit configured to generate N bits of first calibration code and N bits of second calibration code for determining termination resistance;
a transmission line circuit configured to receive the N bits of first and second calibration codes, to transfer the N bits of first calibration code through N number of transmission lines during a first duration and to transfer the N bits of second calibration code through the N number of transmission lines during a second duration; and
an output driver configured to pull-up terminate or pull-down terminate an output node with resistance determined by receiving the N bits of first and second calibration codes, and output data,
wherein the N bits of first and second calibration codes share the N number of transmission lines while the N bits of first and second calibration codes are transferred to the output driver, and
wherein the N is natural number.

22. The semiconductor memory device of claim 21, wherein the output node includes a DQ node.

23. The semiconductor memory device of claim 21, wherein the N bits of first calibration code is generated earlier than the N bits of second calibration code.

24. The semiconductor memory device of claim 21, wherein the first and second durations are divided by a hold signal that is activated when the N bits of second calibration code reaches a target range.

25. The semiconductor memory device of claim 24, wherein the hold signal is generated through comparison of a second calibration node voltage and two reference voltages, the two reference voltages being different from each other by a width of the target range.

26. The semiconductor memory device of claim 21, wherein the transmission line circuit comprises:
transmission lines;

first pass gates configured to be turned on during the first duration to transfer the N bits of first calibration code to the transmission lines; and second pass gates configured to be turned on during the second duration to transfer the N bits of second calibration code to the transmission lines.

27. The semiconductor memory device of claim 26, wherein the first pass gates and the second pass gates are turned on/off in response to a hold signal activated when the N bits of second calibration code falls within a target range, the N bits of second calibration code being generated later than the N bits of first calibration code.

28. The semiconductor memory device of claim 24, wherein the output driver comprises:

a pull-up pre-driver and a pull-down pre-driver;

pull-up termination resistors configured to be turned on/off to output a data having a logic high level under control of the pull-up pre-driver; and pull-down termination resistors configured to be turned on/off to output a data having a logic low level under control of the pull-down pre-driver;

the N bits of first or second calibration code, which is transferred to the transmission lines depending on the first duration or the second duration being inputted to the pull-up pre-driver or the pull-down pre-driver.

29. The semiconductor memory device of claim 28, wherein the output driver further comprises:

first pass gates configured to be turned on during the first duration to transfer the N bits of first calibration code to one of the pull-up pre-driver and the pull-down pre-driver; and second pass gates configured to be turned on during the second duration to transfer the N bits of second calibration code to the other of the pull-up pre-driver and the pull-down pre-driver.

30. The semiconductor memory device of claim 29, wherein the first pass gates and the second pass gates are turned on/off in response to a hold signal activated when the N bits of second calibration code reaches a target range, the N bits of second calibration code being generated later than the N bits of first calibration code.

31. The semiconductor memory device of claim 21, wherein the N bits of first calibration code includes a pull-up calibration code, and the N bits of second calibration code includes a pull-down calibration code.

* * * * *